United States Patent
Kim et al.

(10) Patent No.: US 8,362,832 B2
(45) Date of Patent: Jan. 29, 2013

(54) HALF-BRIDGE THREE-LEVEL PWM AMPLIFIER AND AUDIO PROCESSING APPARATUS INCLUDING THE SAME

(75) Inventors: Bong-Joo Kim, Seoul (KR);
Wang-Seup Yeum, Yongin-si (KR);
Yong-Hee Lee, Yongin-si (KR);
Seung-Bin You, Seongnam-si (KR);
Chun Kyun Seok, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 173 days.

(21) Appl. No.: 12/850,782

(22) Filed: Aug. 5, 2010

(65) Prior Publication Data

US 2011/0064245 A1 Mar. 17, 2011

(30) Foreign Application Priority Data

Sep. 16, 2009 (KR) .................. 10-2009-0087600

(51) Int. Cl.
*H03F 3/38* (2006.01)
(52) U.S. Cl. ..................................... 330/10; 330/207 A
(58) Field of Classification Search ............... 330/10, 330/207 A, 251
See application file for complete search history.

(56) References Cited

U.S. PATENT DOCUMENTS

| 6,700,518 | B2 | 3/2004 | Kishida |
| 7,224,217 | B2 | 5/2007 | Hida et al. |
| 7,737,776 | B1 * | 6/2010 | Cyrusian ........................ 330/10 |
| 2011/0260793 | A1 * | 10/2011 | Jiang et al. .................... 330/251 |

FOREIGN PATENT DOCUMENTS

JP 2001-211036 8/2001

* cited by examiner

*Primary Examiner* — Hieu Nguyen
(74) *Attorney, Agent, or Firm* — F. Chau & Associates, LLC

(57) ABSTRACT

A half-bridge three-level pulse width modulation (PWM) amplifier includes a prescaling unit, a PWM generator configured to convert the input signal to a three-level PWM signal having a first level, a second level and a reference level and an output stage. The prescaling unit scales an input signal according to at least one gain value to provide a scaled signal. The PWM generator varies the width of pulses having the first level and varies the width of pulses having a second level based on the scaled signal. The output stage drives an output node to a level of a first power supply voltage, a second power supply voltage or a third power supply voltage based on the three-level PWM signal. The output node is connected to a load. The magnitude of the at least one gain value compensates for variations of power supply voltages.

20 Claims, 19 Drawing Sheets

PWM OUTPUT (POSITIVE PEAK INPUT)

PWM OUTPUT (ZERO INPUT)

PWM OUTPUT (NEGATIVE PEAK INPUT)

| PWM0 | EN1 | EN2 | EN3 |
|---|---|---|---|
| LEVEL1 | 0 | 0 | 0 |
| LEVEL2 | 1 | 1 | 0 |
| GND | 1 | 0 | 1 |

3-LEVEL PWM OUTPUT
(INCREASING FROM ZERO TO POSITIVE PEAK)

3-LEVEL PWM OUTPUT(POSITIVE PEAK)

3-LEVEL PWM OUTPUT
(DECREASING FROM POSITIVE PEAK TO ZERO)

3-LEVEL PWM OUTPUT(ZERO)

3-LEVEL PWM OUTPUT
(DECREASING FROM ZERO TO NEGATIVE PEAK)

3-LEVEL PWM OUTPUT(NEGATIVE PEAK)

3-LEVEL PWM OUTPUT
(INCREASING FROM NEGATIVE PEAK TO ZERO)

3-LEVEL PWM OUTPUT(ZERO)

HALF-BRIDGE THREE-LEVEL PWM AMPLIFIER AND AUDIO PROCESSING APPARATUS INCLUDING THE SAME

CROSS-REFERENCE TO RELATED APPLICATIONS

This application claims priority, under 35 USC §119, of Korean Patent Application No. 2009-0087600, filed on Sep. 16, 2009 in the Korean Intellectual Property Office (KIPO), the contents of which are herein incorporated by reference in their entirety.

BACKGROUND

1. Technical Field

Exemplary embodiments relate to amplifiers, more particularly to half bridge pulse width modulation (PWM) amplifiers.

2. Description of the Related Art

Pulse width modulation (PWM) is a modulation technique that varies the width of a pulse or of pulses (e.g., among periodic pulses) according to the magnitude of a modulation signal, and the PWM is widely used in amplifiers (for example, class-D audio amplifiers) and in audio apparatus because the PWM has beneficial characteristics such as high efficiency, high resolution and low power consumption.

In general, a PWM-type audio apparatus carries audio signals with PWM signals having a higher frequency than a frequency of a sampling rate of the audio signals. PWM audio amplifiers convert analog audio signals into digital PWM signals and amplifies the PWM signals to be transmitted to a speaker or a headphone.

Full-bridge PWM amplifiers are commonly used for driving speakers, and half-bridge PWM amplifiers are generally used for driving low-power devices such as headphone which receives input signals with respect to a ground level having zero voltage.

Common two-level PWM amplifiers drive load devices such as headphones to two levels, and the two levels correspond to a predetermined positive level and a ground level or a predetermined positive level and a predetermined negative level according to the PWM signals.

The two-level PWM amplifiers can consume current during an inactive audio signal in addition to dynamic current consumed by the active audio signal. Thus two-level PWM amplifiers have a relatively poor power efficiency because output stage continues switching while maintaining 0.5 (50:50) duty ratio even when the audio input signal level is zero. In addition, the two-level PWM amplifiers have a distortion problem in recovered audio signals due to mismatch of power supply voltages of the output stage.

FIG. 1 is a graph of a waveform illustrating an example of an analog amplifier input signal.

FIG. 2 (FIGS. 2a, 2b, and 2c) illustrates a conventional two-level PWM signal with respect to the amplifier input signal of FIG. 1, however the time-scales in FIG. 1 and FIG. 2 are different.

As illustrated in FIG. 1, the amplifier input signal swings between a positive peak voltage MAX and a negative peak voltage MIN. In addition, the conventional two-level PWM signal is a pulse signal having two levels VDD and VSS.

While the amplifier input signal corresponds to the positive peak voltage MAX, the two-level PWM signal has a maximum period at the VDD level and while the amplifier input signal corresponds to the negative peak voltage MIN, the two-level PWM signal has a maximum period at the VSS level. While the analog amplifier input signal is zero ('0'), the two-level PWM signal has 0.5 ("50:50") duty ratio having same high (VDD) width and low (VSS) width. When the analog amplifier input signal increases from zero towards to the positive peak voltage MAX, the two-level PWM signal has a gradually increasing width at the VDD level (and a gradually decreasing width at the VSS level), and when the amplifier input signal decreases from zero towards to the negative peak voltage MIN, the two-level PWM signal has a gradually increasing width at the VSS level (a gradually decreasing width at the VDD level).

The conventional two-level PWM amplifiers (i.e., class-D amplifiers) have a relatively higher efficiency than class-A, class-B and class-AB amplifiers. However, the conventional two-level PWM amplifiers consume current because of continuous switching between VDD level and VSS level (or ground level) even while the analog amplifier input signal is zero ('0').

SUMMARY

Various exemplary embodiments provide a half-bridge three-level pulse width modulation (PWM) amplifier capable of reducing current consumption during silent times and preventing signal distortion due to variations of power supply voltages.

Some exemplary embodiments provide an audio processing apparatus including the disclosed half-bridge three-level. PWM amplifier.

An aspect of the invention provides a three-level PWM amplifier comprising: a PWM generator and an output stage. The PWM generator varies based on the scaled signal the width of pulses having a positive first level relative to ground and varies based on the scaled signal the width of pulses having a negative second level relative to ground, to generate a three-level PWM signal having the first level, the second level and the reference level. The output stage drives an output node to the voltage level of a first power supply voltage, of a second power supply voltage or of a third power supply voltage based on the three-level PWM signal. The three-level PWM amplifier may be a half-bridge three-level PWM amplifier.

According to some aspects of the invention, a half-bridge three-level PWM amplifier includes a prescaling unit, a PWM generator and an output stage. The prescaling unit scales an input signal according to at least one gain value to provide a scaled signal. The PWM generator varies a pulse width having a first level or a second level based on the scaled signal, to generate a three-level PWM signal having the first level, the second level and a reference level. The output stage drives an output node to a level of a first power supply voltage, a second power supply voltage or a third power supply voltage based on the three-level PWM signal. The output node is connected to a load. The at least one gain value has a magnitude for inversely compensating for level variation of at least one of the first through third power supply voltages.

In some embodiments, the third power supply voltage may correspond to a ground level, the first power supply voltage may correspond to a positive voltage higher than the third power supply voltage, and the second power supply voltage may correspond to a negative voltage lower than the third power supply voltage.

In some embodiments, the half-bridge three-level PWM amplifier may further include a power level sensing unit that provides the at least one gain value to the prescaling unit based on the level variation of at least one of the first and second power supply voltages.

The power level sensing unit may include an analog to digital converter that provides digital values corresponding to the measured levels of the first and second power supply voltages and a calculation unit calculates and provides the at least one gain value based on the digital values.

The calculation unit may compare the digital values to provide the at least one gain value.

The calculation unit may provide the at least one gain value based on ideal levels of the first and second power supply voltages and the measured level variations of the first and second power supply voltages.

In some embodiments, the prescaling unit may include a signal separator that separates the input signal into a first input signal and a second input signal based on the reference level where the first input signal has levels equal to or higher than the reference level and the second input signal has levels lower than the reference level; a scaler that multiplies the first input signal or the second input signal by the at least one gain value to provide a first scaled signal (and a second scaled signal); and an adder that sums the first and second scaled signals to provide the scaled input signal.

The prescaling unit may provide the first and second scaled signals by multiplying each of the first and second input signals by each of the first and second gain values. The first and second gain values may be included in the at least one gain value.

The prescaling unit may provide the first scaled signal by multiplying the first input signal by the at least one gain value.

The prescaling unit may provide the second scaled signal by multiplying the second input signal by the at least one gain value.

The prescaling unit may scale the first and second input signals asymmetrically.

In some embodiments, the PWM generator may combine a first PWM signal and a second PWM signal to output the three-level PWM signal, the first PWM signal is obtained by varying the pulse width having the first level according to a first scaled signal and the second PWM signal is obtained by varying the pulse width having the second level according to a second scaled signal. The first and second scaled signals may be included in the scaled input signal, and the first scaled signal may have levels equal to or greater than the reference level and the second signal may have levels lower than the reference level.

The reference level may correspond to a ground level, the first scaled signal may be a positively scaled signal, and the second scaled signal may be a negatively scaled signal.

The PWM generator may include a first comparator that compares the (positive) first scaled signal with a first triangular wave signal to output the first PWM signal; and a second comparator that compares the (negative) second scaled signal with a second triangular wave signal to output the second PWM signal.

In some embodiments, the output stage may include a pull-up unit that drives the output node to the level of the first power supply voltage in response to a first enable signal; a pull-down unit that drives the output node to the level of the second power supply voltage in response to a second enable signal; and a switching ground unit that drives the output node to the level of the third power supply voltage in response to a third enable signal. The third power supply voltage may correspond to a ground level, the first power supply voltage may correspond to a positive voltage higher than the third power supply voltage, and the second power supply voltage may correspond to a negative voltage lower than the third power supply voltage.

The pull-up unit may include a pull-up transistor, connected between the output node and the first power supply voltage, which is turned ON/OFF in response to the first enable signal, the pull-down unit may include a pull-down transistor, connected between the output node and the second power supply voltage, which is turned ON/OFF in response to the second enable signal, and the switching ground unit may include at least one switch, connected between the output node and the third power supply voltage, which is turned ON/OFF in response to the third enable signal.

In some embodiments, the scaled input signal may be a sigma-delta modulated signal.

Another aspect of the invention provides an audio processing apparatus comprising a volume control unit and a half-bridge three-level PWM amplifier. The volume control unit volume-controls audio source data in response to a volume control signal to provide a volume-controlled input signal to the half-bridge three-level PWM amplifier. The half-bridge three-level PWM amplifier converts the input signal to a three-level PWM signal having a first level, a second level and a reference level and is configured to drive an output node connected to a load based on the three-level PWM signal.

The half-bridge three-level PWM amplifier includes a prescaling unit, a PWM generator and an output stage. The prescaling unit scales the volume-controlled input signal according to at least one gain value to provide a scaled input signal. The PWM generator generates a three-level PWM signal having the first level, the second level and a reference level by varying based on the scaled signal the width of pulses having the first level and by varying based on the scaled signal the width of pulses having the second level. The output stage drives an output node to a level of a first power supply voltage, a second power supply voltage or a third power supply voltage based on the three-level PWM signal. The output node is connected to a load. The at least one gain value has a magnitude controlled to inversely compensate for variations of the level of at least one of the first through third power supply voltages.

According to some exemplary embodiments, the half-bridge three-level PWM amplifier is capable of preventing unnecessary current consumption and of recovering undistorted audio signal even when the variations of the power supply voltages occur.

Various exemplary embodiments will be described more fully hereinafter with reference to the accompanying drawings, in which some exemplary embodiments are shown. The present inventive concept may, however, be embodied in many different forms and should not be construed as limited to the exemplary embodiments set forth herein. Rather, these exemplary embodiments are provided so that this disclosure will be thorough and complete, and will fully convey the scope of the present inventive concept to those skilled in the art. In the drawings, the sizes and relative sizes of circuits and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" or "provided" or "input" to another element, it can be directly connected or coupled or provided or input to the other element or intervening elements or intervening transformations (e.g., signal scaling) may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular exemplary embodiments only and is not intended to be limiting of the present inventive concept. As used herein, the singular forms "a," "an" and "the" are intended to include the plural forms as well, unless the context clearly indicates otherwise.

BRIEF DESCRIPTION OF THE DRAWINGS

Exemplary embodiments of the invention will be more clearly understood from the following detailed description taken in conjunction with the accompanying drawings, in which.

DETAILED DESCRIPTION OF EXEMPLARY EMBODIMENTS OF THE INVENTION

Figure 3:
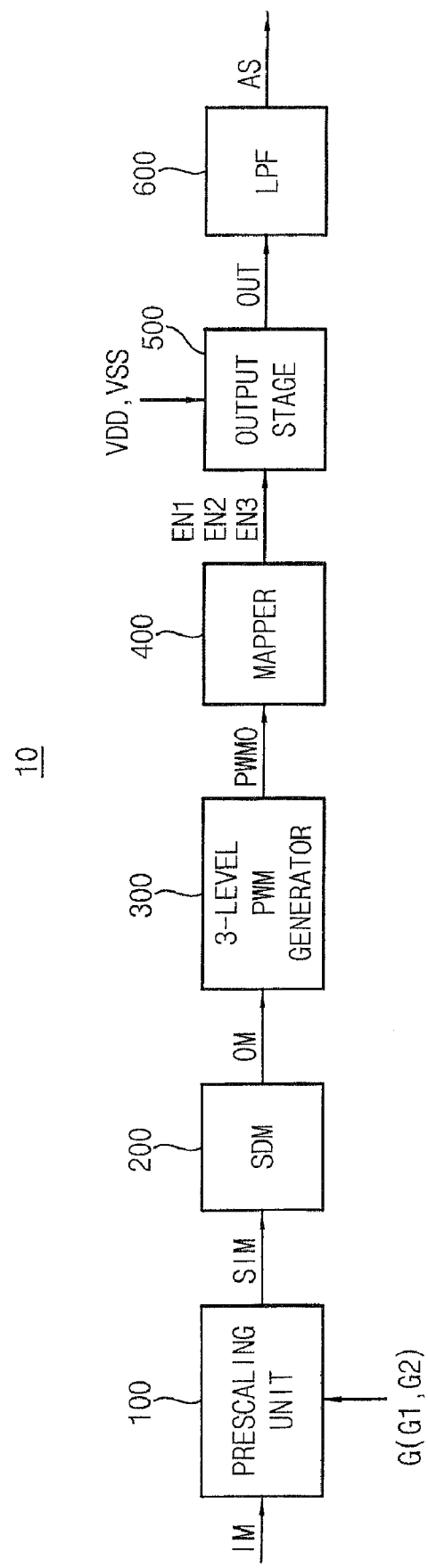
FIG. 3 is a block diagram of a half-bridge PWM amplifier 10 according to an exemplary embodiment.

FIG. 3 is a block diagram of a half-bridge PWM amplifier according to an exemplary embodiment.

Referring to FIG. 3, a three-level half-bridge PWM amplifier 10 includes a prescaling unit 100, a sigma-delta modulator (SDM) 200, a three-level PWM generator 300, a mapper 400 and an output stage 500. The three-level PWM amplifier 10 may further include low pass filter (LPF) 600.

Figure 4:
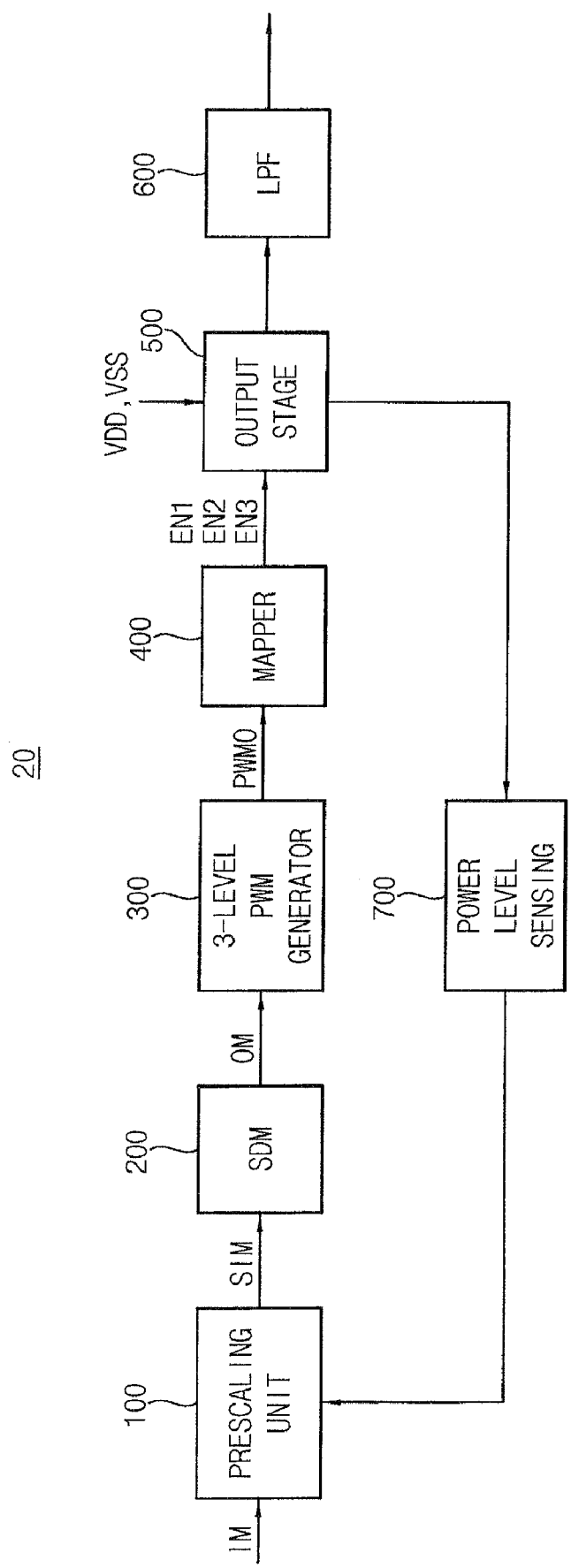
FIG. 4 is a block diagram of a half-bridge PWM amplifier 10 according to another exemplary embodiment.

FIG. 4 is a block diagram of a half-bridge PWM amplifier according to another exemplary embodiment.

Referring to FIG. 4, a three-level half-bridge PWM amplifier 20 includes the prescaling unit 100, the SDM 200, the three-level PWM generator 300, the mapper 400, the output stage 500, the LPF 600 and a power level sensing unit 700. The input signal IM is a pulse code modulation (PCM) signal such as a pulse-code modulated audio source signal.

The prescaling unit 100 scales an input signal IM according to at least one gain value G (G1 and G2) to provide a scaled signal SIM. The at least one gain value G (G1 and G2) may have a magnitude for inversely compensating for level variations of first and second power supply voltages VDD and VSS which are supplied to the output stage 500. The at least one gain value G (G1 and G2) may be predetermined or may be dynamically selected based on feedback from the power level sensing unit 700 in FIG. 7. Structure and operation of the prescaling unit 100 will be described later.

The SDM 200 quantizes the analog input signal IM. Sigma-delta modulation along with over-sampling may reduce quantization noise of the PCM data and obtain high resolution. Although not illustrated in FIG. 3, an over-sampler may be inserted between the prescaling unit 100 and the SDM 200. For example, when the amplifier is an audio amplifier, audio input signal has a relatively high resolution that renders direct conversion from the audio input signal to a PWM signal, Therefore, the resolution of the scaled signal SIM needs to be lowered enough to be converted to a PWM signal by using the over-sampler.

Figure 5:
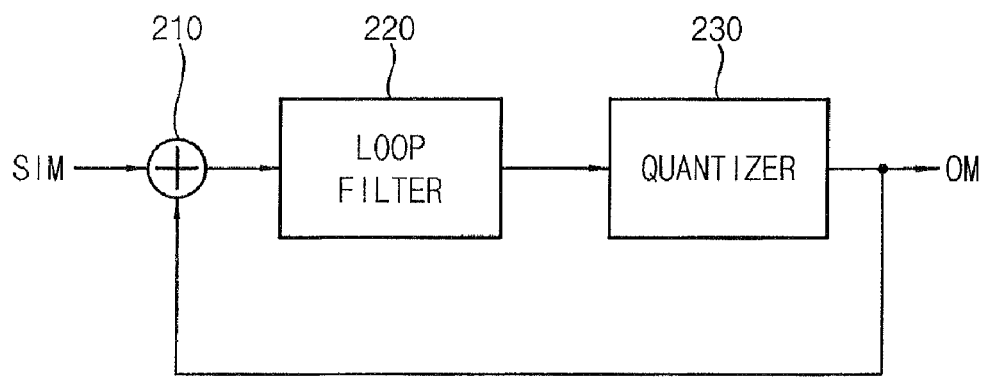
FIG. 5 is a block diagram of an exemplary implementation of the SDM 200 in the three-level PWM amplifier 10 of FIG. 3.

FIG. 5 is a block diagram of an exemplary implementation of the sigma-delta modulator (SDM) 200 in the three-level PWM amplifier 10 of FIG. 3 and FIG. 4.

Referring to FIG. 5, a sigma-delta modulator SDM 200 includes an adder 210, a loop filter 220 and an M-bit quantizer 230. Therefore, the output signal OM of the SDM 200 is an M-bit quantized signal. M is a smaller number of bits than the scaled signal SIM that is the pulse code modulated audio source signal. For example, when the scaled signal SIM includes 16 bits or 20 bits, the output signal OM may include 4 bits or 5 bits.

Figure 6:
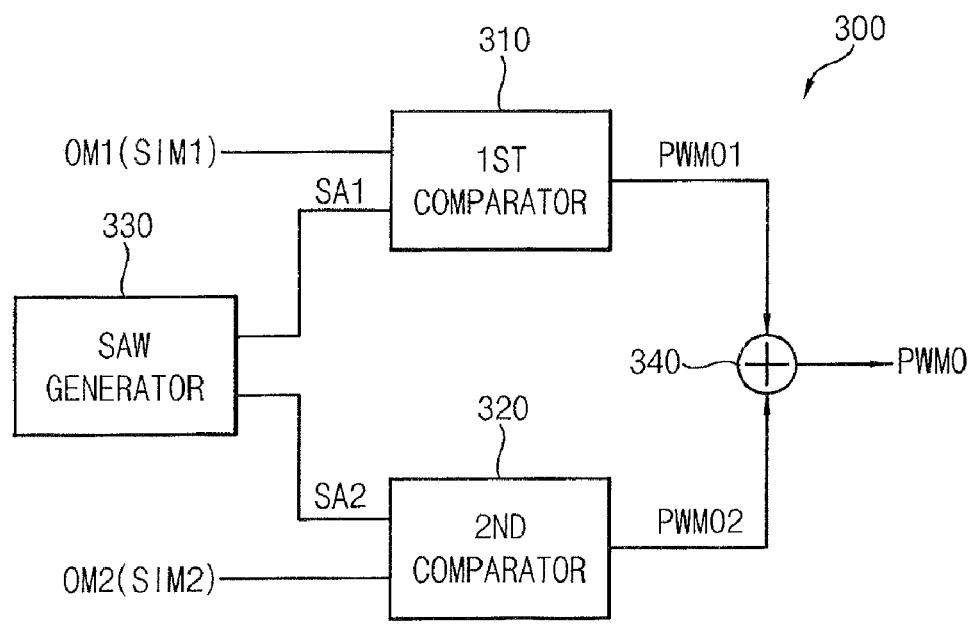
FIG. 6 is a block diagram of an exemplary implementation of the three-level PWM generator 300 in the three-level PWM amplifier 10 of FIG. 3 according to exemplary embodiments.

FIG. 6 is a block diagram of an exemplary implementation of the three-level PWM generator 300 in the FIG. 3.

Referring to FIG. 6, a three-level PWM generator 300 generates and outputs a PWM signal PWMO by varying the pulse width and selecting the pulse boundary voltages according to the magnitude (level) of an input signal (i.e., of the output signal OM of the SDM 200).

Figure 13:
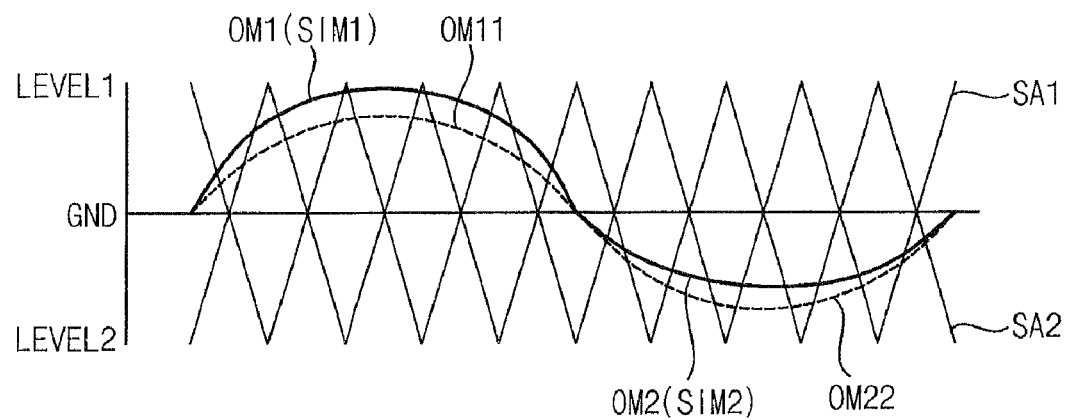
FIG. 13 is a graph illustrating pulse-width modulation of waveforms of the signal input to the three-level PWM generator 300 of FIG. 6.

The three-level PWM generator 300 may be an analog PWM generator. The three-level PWM generator 300 includes a ramp signal generator (denoted as SAW GENERATOR) 330, a first comparator 310, a second comparator 320 and an adder 340. The ramp signal generator generates first and second triangular wave signals SA1 and SA2 as illustrated in FIG. 13. As illustrated in FIG. 13, the first triangular wave signal SA1 alternatively increases and decreases between a first level LEVEL1 (for example, a predetermined positive voltage) and a reference level (for example, ground level) periodically. The second triangular wave signal SA1 alternatively increases and decreases between the reference level and a second level LEVEL2 (for example, a predetermined negative voltage). The first and second triangular wave signals SA1 and SA2 have same period and wave form. However, the first and second triangular wave signals SA1 and SA2 have opposite phases with respect to each other.

The first comparator 310 compares the first triangular wave signal SA1 and a first input signal OM1 (i.e., positively scaled signal) to output a first output signal PWMO1 indicating a first comparison result. The second comparator 320 compares the second triangular wave signal SA2 and a second input signal OM2 (i.e., negatively scaled signal) to output a second output signal PWMO2 indicating a second comparison result. The adder 340 adds the first and second output signals PWMO1 and PWMO2 to output the PWM signal PWMO.

The first input signal OM1 (i.e., positively scaled signal) may be a signal having a level equal to or above the reference level of the output signal OM. The second input signal OM2 (i.e., negatively scaled signal) may be a signal having a level below the reference level of the output signal OM of the SDM 200. The first comparator 310 outputs the first level LEVEL1 when the first input signal OM1 is greater than the first triangular wave signal SA1 and outputs the reference level when the first input signal OM1 is lower than the first triangular wave signal SA1. The second comparator 320 outputs the reference level when the second input signal OM2 is greater than the second triangular wave signal SA2 and outputs the second level LEVEL2 when the second input signal OM2 is lower than the second triangular wave signal SA2. As is described, the three-level PWM generator 300 may generate the PWM signal PWMO having the first (LEVEL1), second (LEVEL2) and reference levels.

Figure 7:
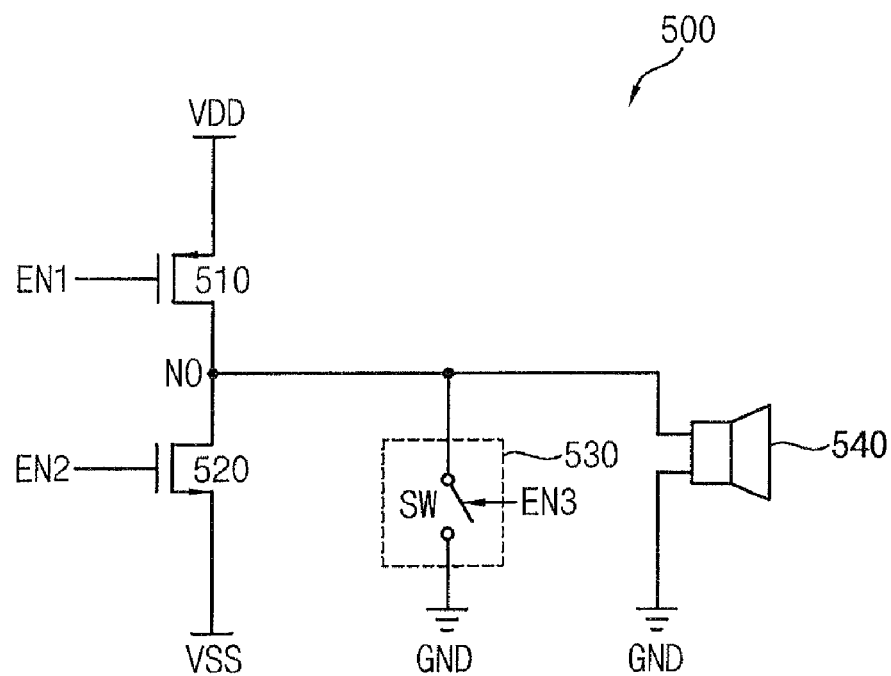
FIG. 7 is a circuit diagram of an exemplary implementation of the output stage 500 in the three-level PWM amplifier 10 of FIG. 3.

FIG. 7 is a circuit diagram of an exemplary implementation of the output stage 500 in the three-level PWM amplifier (10 or 20) of FIGS. 3 and 4.

The output stage 500 drives an output node NO to the level of a first power supply voltage VDD, to the level of a second power supply voltage VSS or to the level of a third power supply voltage GND, based on the three-level PWM signal PWMO.

Referring to FIG. 7, the output stage 500 includes a pull-up transistor 510, (also referred to as pull-up unit), a pull-down transistor 520 (also, referred to as pull-down unit) and a switching ground unit 530. The pull-up transistor 510 is connected between the first power supply voltage VDD and the output node NO, and drives the output node to the level of the first power supply voltage VDD in response to a first enable signal EN1. The output node NO is connected to one terminal of a load 540 such as a headphone, an earphone or a headset. The other terminal of the load 540 is connected to the ground GND.

The pull-down transistor 520 is connected between the output node NO and the second power supply voltage VSS, and drives the output node NO to the level of the second power supply voltage VSS in response to a second enable signal EN2. The switching ground unit 530 is connected between the output node NO and the third power supply voltage GND, and is turned ON/OFF in response to a third enable signal EN3. When the switching ground unit 530 is turned ON, the output NO is connected to the third power supply voltage GND, and the level of the output NO is ground level. The switching unit 530 may include at least one switch SW, which may be implemented as one or more transistors figured as a transmission gate.

Output signal OUT from the output stage 500 is low-pass filtered by the low pass filter (LPF) 600, and is thereby recovered as an audio signal AS. The levels of the first and second power supply voltages VDD and VSS supplied to the output stage 500 may be substantially matched with respect to each other such that the waveform of the audio signal AS may be substantially the same as the original audio source signal. When the levels of the first and second power supply voltages VDD and VSS are not matched with respect to each other, the audio signal AS may have asymmetry proportional to mismatches of the levels of the first and second power supply voltages VDD and VSS. The asymmetry of the audio signal AS results in increased harmonic distortions which degrade performance of the amplifiers. In exemplary embodiments, when physical asymmetry of the levels of the power supply voltages are inevitable, asymmetric distortions that may occur in recovered audio signals are compensated for in advance before the PWM.

Figure 8:
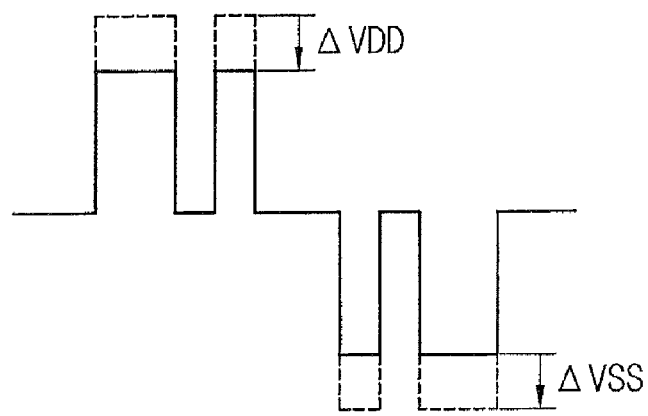
FIG. 8 is a graph illustrating the level variations of the first and second power supply voltages occur in the output stage 500 in the three-level PWM amplifier 10 of FIG. 3.

FIG. 8 is a graph illustrating the level variations of the first and second power supply voltages that may occur in the output stage 500 in FIG. 3.

FIG. 8 illustrates a case where there is asymmetry in the magnitudes (absolute value) of the first and second power supply voltages VDD and VSS when level variations occur in the first and second power supply voltages VDD and VSS supplied to the output stage 500. In such a case, there is asymmetry between positive and negative components in the PWM signal PWMO for driving the load 540 in the output stage 500, and thus a distortion in the audio signal AS to be recovered. The distortion is proportional to a ratio of the magnitudes of the first and second power supply voltages VDD and VSS.

Figure 9:
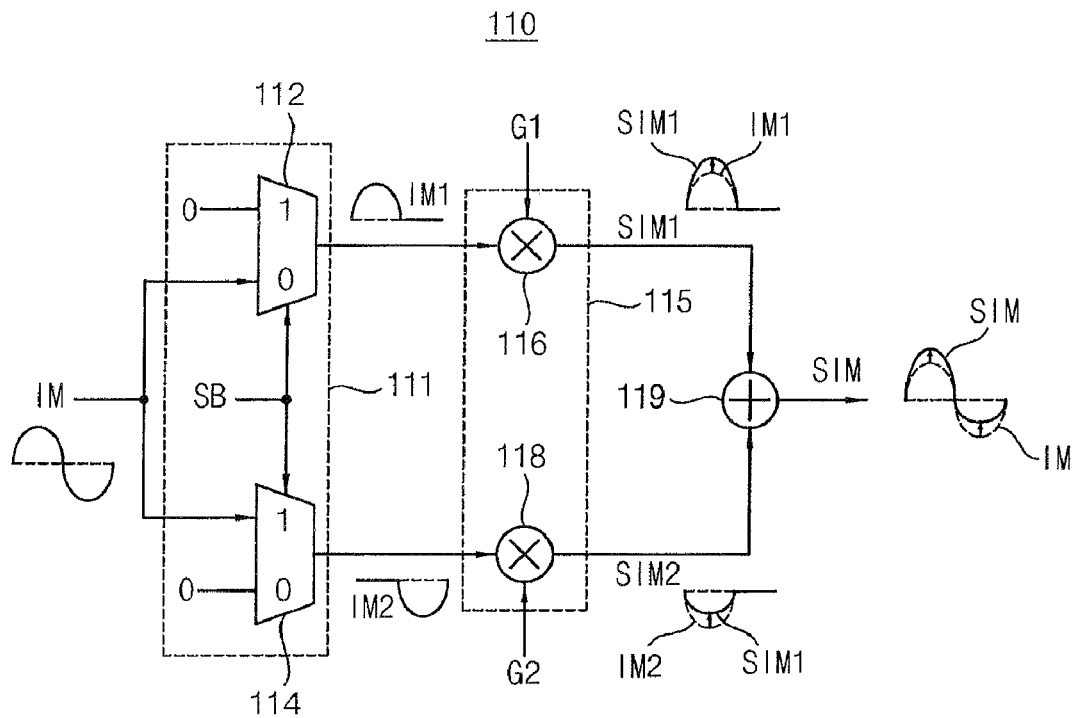
FIG. 9 is a block diagram of an exemplary implementation 110 of the prescaling unit 100 in the three-level PWM amplifier 10 of FIG. 3 according to some exemplary embodiments.

FIG. 9 is a block diagram of an exemplary implementation 110 of the prescaling unit 100 in the three-level PWM amplifier 10 or 20 of FIGS. 3 and 4.

In FIG. 9, first and second input signals IM1 and IM2 are separated from IM and respectively scaled. The first input signal IM1 has a level equal to or above the reference level of the input signal IM, and the second input signal IM2 has a level below the reference level of the input signal IM. In addition, there is a correlation of reference values (transition points) between the first and second input signals IM1 and IM2.

Referring to FIG. 9, a prescaling unit 110 includes a signal separator 111, a scaler unit 115 and an adder 119. The scaler unit 115 includes first and second multipliers 116 and 118. The signal separator 111 includes first and second multiplexers 112 and 114.

The signal separator 111 separates the input signal IM into the (positive) first input signal IM1 and the (negative) second input signal IM2 based on the reference level. The first multiplexer 112 selects each portion of the input signal IM having a level equal to or above the reference level to provide the (positive) first input signal IM1 according to a sign bit SB of the input signal IM. And the second multiplexer 114 selects each portion of the input signal IM having a level below the reference level to provide the (negative) second input signal IM2 according to the sign bit SB of the input signal IM. The sign bit SB may have a first logic level (i.e., "0") when the input signal IM has a level equal to or above the reference level, and the bit SB may have a second logic level (i.e., "1") when the input signal IM has a level below the reference level. Accordingly, when the input signal IM has a level equal to or above the reference level, the first multiplexer 112 outputs the (positive) first input signal IM1. When the input signal IM has a level below the reference level, the second multiplexer 114 outputs the second input signal IM2.

The scaler unit 115 includes the first and second multipliers (scalers) 116 and 118. The first multiplier 116 multiplies the (positive) first input signal IM1 by a first gain value G1 to provide a first scaled signal SIM1. The second multiplier 118 multiplies the second input signal IM2 by a second gain value G2 to provide a second scaled signal SIM2. The first and second gain values may be predetermined or may be dynamically provided from the power level sensing unit 700 in FIG. 4.

Let's assume that during operation the level of the first power supply voltage VDD decreases by $^{\Delta}$VDD with respect to the normal (ideal) level $VDD_{ideal}$, and that the level of the second power supply voltage VDD increases by VSS with respect to the normal (ideal) level $VSS_{ideal}$ as illustrated in FIG. 8, and that varied levels of the first and second power supply voltages VDD and VSS are provided to the output stage 500. In this case, the positive portion of the audio signal AS to be recovered may be varied by $(VDD_{ideal}-^{\Delta}VDD)/VDD_{ideal}$, and the negative portion of the audio signal AS to be recovered may be varied by $(VSS_{ideal}-^{\Delta}VSS)/VSS_{ideal}$, when the prescaling unit 100 is not included. As a result, the audio signal AS may have substantial distortion.

However, according to various exemplary embodiments, the audio signal may have symmetry because the prescaling unit 110 scales the gain value enough to cancel the affect of level variations of the power supply voltages in advance of recovering the audio signal AS. Here, the first gain value G1 for compensating for the variation of the positive portion of audio signal AS preferably corresponds to $VDD_{ideal}/(VDD_{ideal}-^{\Delta}VDD)$. In addition, the second gain value G2 for compensating for the variation of the negative portion of audio signal AS, preferably corresponds to $VSS_{ideal}/(VSS_{ideal}-^{\Delta}VSS)$. Therefore, the level of the first scaled signal SIM1 is varied (increased) by $VDD_{ideal}/(VDD_{ideal}-^{\Delta}VDD)$ with respect to the first input signal IM1, and the level of the second scaled signal SIM2 is varied (decreased, i.e., more negative) by to $VSS_{ideal}/(VSS_{ideal}-^{\Delta}VSS)$ with respect to the second input signal IM2. Since scaled signal SIM is input to the SDM 200, the three-level PWM generator 300 and the output stage 500 and since the prescaling unit 110 scales the gain value enough for canceling the level variations of the power supply voltages in advance, there is no asymmetry in the positive and negative portions of the audio signal AS even when there are level variations in the first and second power supply voltages VDD and VSS.

The scaling may be respectively performed on the first and second input signals IM1 and IM2 as illustrated in FIG. 9. Alternatively, scaling may be performed on only one of the first and second input signals IM1 and IM2 (as shown in FIG. 10).

Figure 10:
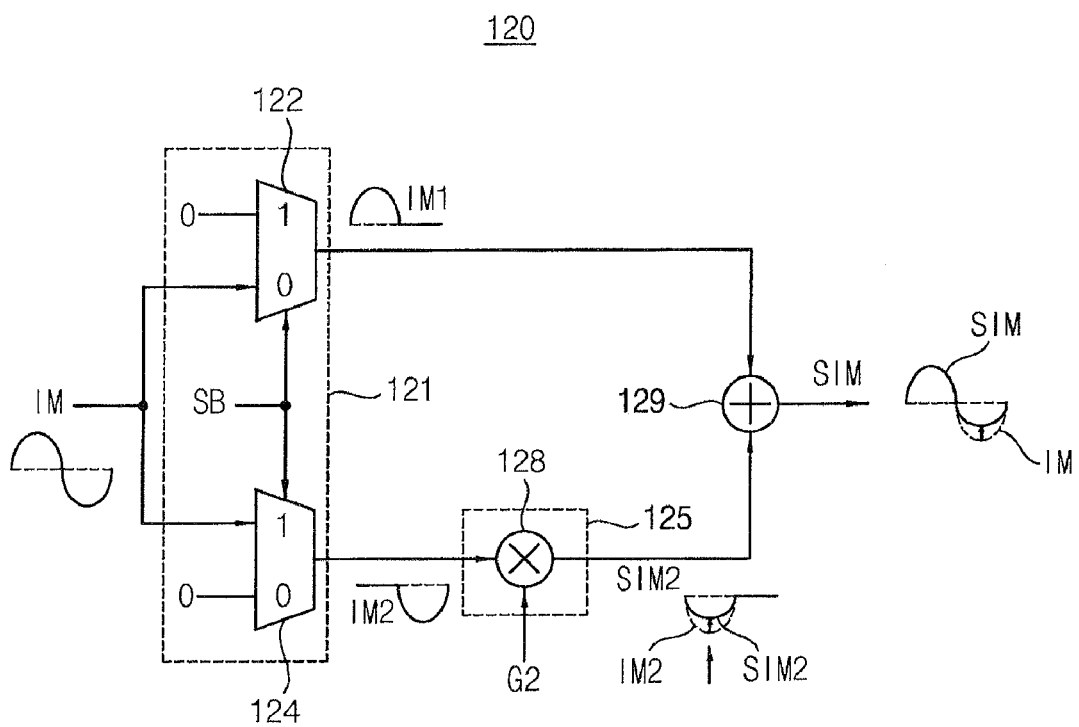
FIG. 10 is a block diagram of another exemplary implementation 120 of the prescaling unit 100 in the three-level PWM amplifier 10 of FIG. 3.

FIG. 10 is a block diagram of another exemplary implementation 120 of the prescaling unit in the three-level PWM amplifier 10 or 20 of FIGS. 3 and 4. In FIG. 10, only the first input signal IM1 is scaled.

Referring to FIG. 10, a prescaling unit 120 includes a signal separator 121, a scaler 125 and an adder 129. The scaler 125 includes one multiplier 128. The signal separator 121 includes first and second multiplexer 122 and 124.

The signal separator 121 separates the input signal IM into the (positive) first input signal IM1 and the (negative) second input signal IM2 based on the reference level. The first multiplexer 122 selects each portion of the input signal IM having a level equal to or above the reference level to provide the first input signal IM1 according to the sign bit SB of the input signal IM, and the second multiplexer 124 selects each portion of the input signal IM having a level below the reference level to provide the second input signal IM2 according to the sign bit SB of the input signal IM.

In FIG. 10, the scaler 125 includes the multiplier 128 and the multiplier 128 multiplies the second input signal IM2 by the second gain value G2 to provide the second scaled signal SIM2. The adder 129 sums the first input signal IM1 and the second scaled signal SIM2 to provide the scaled signal SIM. Therefore, a positive portion of the scaled signal SIM is same as a positive portion of the input signal IM (i.e., the first input signal IM1), and the level of the second scaled signal SIM2 is varied (decreased, more negative) by the second gain value G2 with respect to the negative portion of the input signal IM (i.e., the second input signal IM2). The second gain value G2 may be predetermined or may be provided from the power level sensing unit 700 in of FIG. 4. The second gain value G2 may correspond to the ratio of absolute values |VDD|/|VSS|. When the second input signal IM2 is scaled, there is no asymmetry in the audio signal AS recovered.

Figure 11:
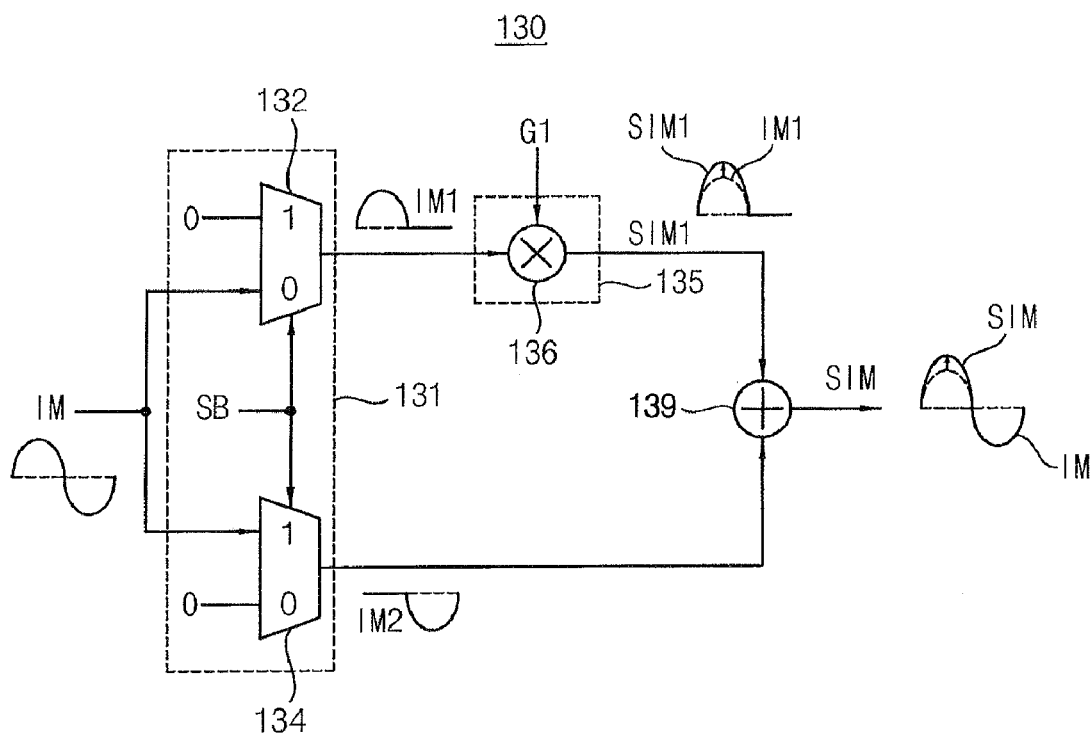
FIG. 11 is a block diagram of an example of the prescaling unit in FIG. 3 according to other exemplary embodiments.

FIG. 11 is a block diagram of another exemplary implementation 130 of the prescaling unit 100 in the three-level PWM amplifier 10 or 20 of FIGS. 3 and 4. In FIG. 11, only the first input signal IM1 is scaled.

Referring to FIG. 11, a prescaling unit 130 includes a signal separator 131, a scaler unit 135 and an adder 139. The scaler 135 includes one multiplier 136. The signal separator 131 includes first and second multiplexers 132 and 134.

The signal separator 131 separates the input signal IM into the (positive) first input signal IM1 and the (negative) second input signal IM2 based on the reference level. The first multiplexer 132 selects each portion of the input signal IM having a level equal to or above the reference level to provide the first input signal IM1 according to the sign bit SB of the input signal IM, and the second multiplexer 134 selects each portion of the input signal IM having a level below the reference level to provide the second input signal IM2 according to the sign bit SB of the input signal IM.

In FIG. 11, the scaler 135 includes the multiplier 136 and the multiplier 136 multiplies the first input signal IM1 by the first gain value G1 to provide the (positive) first scaled signal SIM1. The adder 139 sums the first scaled signal SIM1 and the second input signal IM2 to provide the scaled signal SIM. Therefore, the negative portion of the scaled signal SIM is same as the negative portion of the input signal IM (i.e., the second input signal IM2), and the level of the first scaled signal SIM1 is varied (increased) by the first gain value G1 with respect to the positive portion of the input signal IM (i.e., the first input signal IM1). The first gain value G1 may be predetermined or may be provided from the power level sensing unit 700 in of FIG. 4. The first gain value G1 may correspond to the ratio of absolute values |VSS|/|VDD|. When the first input signal IM1 is scaled, there is no asymmetry in the audio signal AS to be recovered.

Although FIGS. 9 through 11 illustrates that the level of the first power supply voltage VDD decreases by $^\Delta$VDD and the level of the second power supply voltage VDD increases by $^\Delta$VSS, the exemplary implementations 110, 120, 130 of the prescaling unit 100 may also be used when the level of the first power supply voltage VDD increases by $^\Delta$VDD and the level of the second power supply voltage VDD decreases by $^\Delta$VSS. Thus, the exemplary implementations 110, 120, 130 of the prescaling unit 100 may be applicable when there are any (increasing or decreasing) level variances in the absolute values of the first and second power supply voltages VDD and VSS. Thus, the prescaling unit 100 may scale the first and second input signals IM1 and IM2 asymmetrically in any case of (increasing or decreasing) level variances in the absolute values of the first and second power supply voltages VDD and VSS.

Figure 12A:
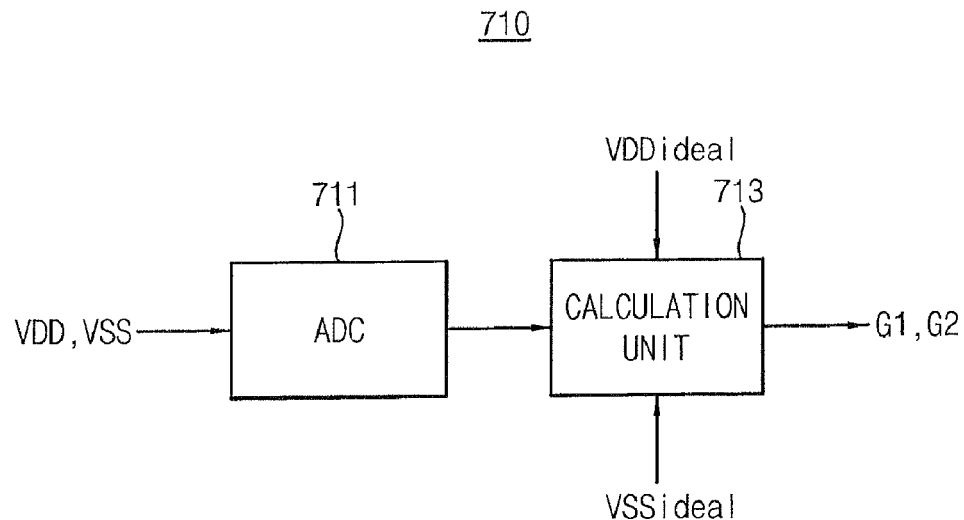
FIG. 12A is a block diagram of an exemplary implementation 710 of the power level sensing unit 700 in the three-level PWM amplifier 20 of FIG. 4.

FIG. 12A is a block diagram of an exemplary implementation 710 of the power level sensing unit 700 in the three-level PWM amplifier 20 of FIG. 4.

The power level sensing unit 710 of FIG. 12A along with the prescaler 110 in FIG. 9 may be employed in the three-level PWM amplifier 20 of FIG. 4.

Referring to FIG. 12A, the power level sensing unit 710 includes an analog to digital converter (ADC) 711 and a calculation unit 713. The ADC 711 provides digital values each corresponding to the levels of the first and second power supply voltages VDD and VSS. The calculation unit 713 calculates the gain values G1 and G2 based on the digital values from the ADC 711, and provides the gain values G1 and G2 to the prescaling unit 100. The calculation unit 713 calculates the difference $^\Delta$VDD between the digital value corresponding to the level of the first power supply voltage VDD and the normal ideal level $VDD_{ideal}$ of the first power supply voltage VDD and provides the scaling unit 100 with the first gain value G1 corresponding to $VDD_{ideal}/(VDD_{ideal}-^\Delta VDD)$ according to the calculated difference. In addition, the calculation unit 713 calculates the difference VSS between the digital value corresponding to the level of the second power supply voltage VSS and the normal level $VSS_{ideal}$ of the second power supply voltage VSS and provides the scaling unit 100 with the second gain value G2 corresponding to $VSS_{ideal}/(VSS_{ideal}-^\Delta VSS)$ according to the calculated difference.

Figure 12B:
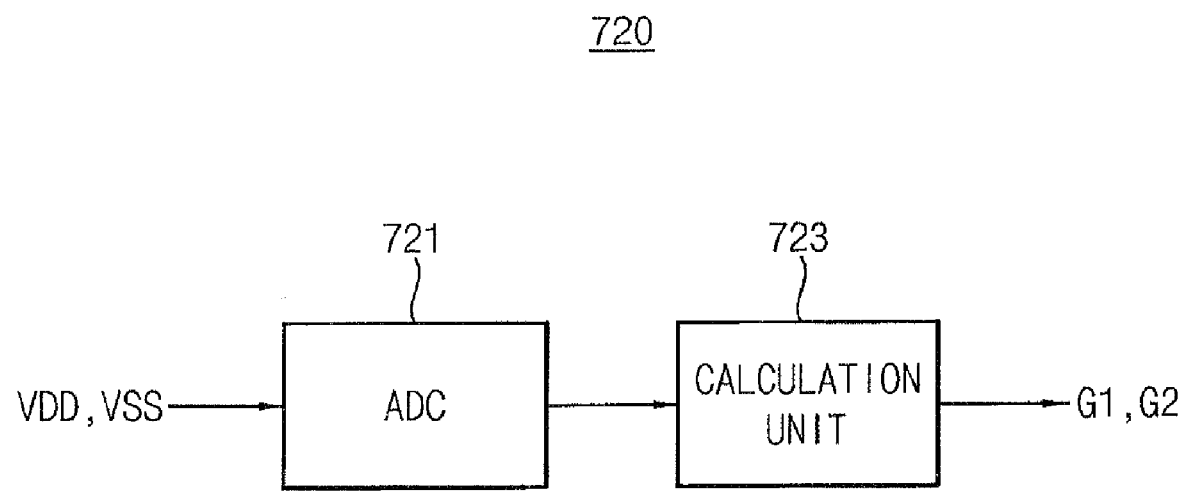
FIG. 12B is a block diagram of another exemplary implementation 720 of the power level sensing unit 700 in the three-level PWM amplifier 20 of FIG. 4.

FIG. 12B is a block diagram of another exemplary implementation 720 of the power level sensing unit 700 in the three-level PWM amplifier 20 of FIG. 4.

The power level sensing unit 720 of FIG. 12B along with the prescaler 120 in FIG. 10 or the prescaler 130 in FIG. 11 may be employed in the three-level PWM amplifier 20 of FIG. 4.

Referring to FIG. 12B, the power level sensing unit 720 includes an ADC 721 and a calculation unit 723. The ADC 721 provides digital values each corresponding to the levels of the first and second power supply voltages VDD and VSS. The calculation unit 723 calculates the first gain value G1 or the second gain value G2 based on the digital values, and provides the gain values G1 or G2 to the prescaling unit 100. The calculation unit 723 compares absolute values of the levels of the first and second power supply voltages VDD and VSS. The calculation unit 723 provides the first gain value G1 corresponding to the ratio of absolute values |VSS|/|VDD| when the absolute value of the first power supply voltage VDD is greater than the absolute value of the second power supply voltage VSS. The calculation unit 723 provides the second gain value G2 corresponding to the ratio of absolute values |VDD|/|VSS| when the absolute value of the first power supply voltage VDD is smaller than the absolute value of the second power supply voltage VSS.

The three-level PWM amplifier 20 of FIG. 4 employing the power level sensing unit 700, is reliable even when the amount of the mismatch of the power supply voltage is not constant, or when it is difficult to fix the gain values G1 and G2.

FIG. 13 is a graph illustrating pulse-width modulation of waveforms of the signals input to the three-level PWM generator 300 of FIG. 6.

Figure 14A:
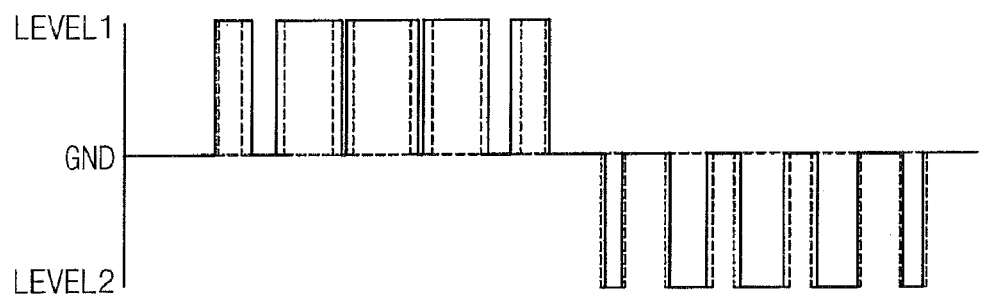
FIGS. 14A and 14B are graphs illustrating the pulse-width modulated waveforms output by the three-level PWM generator 300 of FIG. 6 based on the signal input in FIG. 13.
Figure 14B:
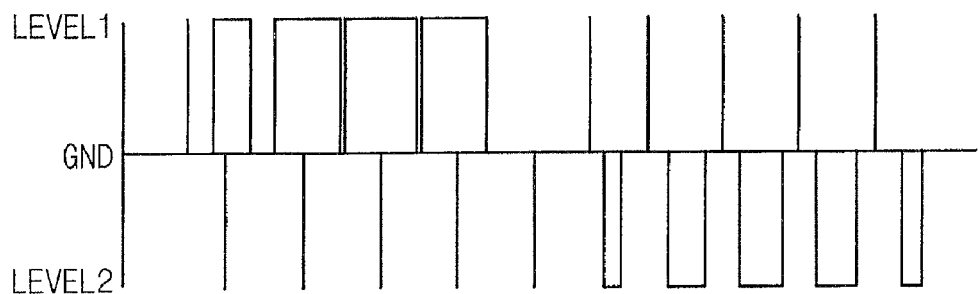

FIGS. 14A and 14B are graphs illustrating the pulse-width modulated waveforms output by the three-level PWM generator 300 of FIG. 6 based on the signal input in FIG. 13.

In FIG. 13, dotted line indicates the input signals when the prescaling unit 100 is not included in the three-level PWM amplifier 20 of FIG. 4 for comparison with the case when the prescaling unit 100 is included in the three-level PWM amplifier 20 of FIG. 4. In addition, in FIG. 14, dotted line indicates the three-level PWM signal when the prescaling unit 100 is not included in the three-level PWM amplifier 20 of FIG. 4 for comparison with a case when the prescaling unit 100 is included.

Referring to FIGS. 3 through 14B, the operation of the half-bridge three-level PWM amplifier 10 or 20 will be described further.

The first scaled signal SIM1 is sigma-delta modulated into the first input signal OM1. During the first interval when a positive input signal OM1 (the positive input signal OM1 has a level above the ground level of the input signal OM) is input, the first comparator 310 outputs the first level LEVEL1 when the first input signal OM1 is greater than the first triangular wave signal SA1 and outputs the reference level GND when the first input signal OM1 is lower than the first triangular wave signal SA1. The first input signal OM1 may have a higher level than an input signal OM11, because the prescaling unit 100 multiplies the first input signal IM1 by the first gain value G1 based on the level variations of the first and second power supply voltages VDD and VSS.

During the first interval, the second comparator 320 may output a minimum pulse signal having the second level LEVEL2 at every period of the second triangular wave signal SA2 (for example, whenever the second triangular wave signal SA2 has the reference level GND). The pulse width of the PWM signal may range from a predetermined minimum magnitude to a maximum magnitude. The minimum pulse signal is a pulse signal having a minimum magnitude, and also referred to as return-zero pulse.

The second scaled signal SIM2 is sigma-delta modulated into the second input signal OM2. During a second interval when the negative input signal OM2 (the negative input signal OM2 has a level below the ground level of the input signal OM) is input, the second comparator 320 outputs the reference level GND when the second input signal OM2 is higher than the second triangular wave signal SA2 and outputs the second level LEVEL2 when the second input signal OM2 is lower than the second triangular wave signal SA2. The second input signal OM2 may have a lower level than an input signal OM22, because the prescaling unit 100 multiplies the second input signal IM2 by the second gain value G2 based on the level variations of the first and second power supply voltages VDD and VSS.

During the second interval, the first comparator 310 may output a minimum pulse signal having the first level LEVEL1 at every period of the first triangular wave signal SA1 (for example, whenever the first triangular wave signal SA1 has the first level LEVEL1).

Therefore, the PWM signal PWMO, which is sum of the first output signal PWMO1 and the second output signal PWMO2, is a three-level pulse signal having the first level LEVEL1, the second level LEVEL2 and the reference level GND as illustrated in FIG. 14A (solid line). When the first and second comparators 310 and 320 output the minimum pulse signals, the PWM signal PWMO may be as illustrated in FIG. 14B.

Referring again to FIGS. 13 and 14A, it is noted that the first input signal OM1 is scaled by the first gain value G1 with respect to the input signal OM11, and the pulse width of the first output signal PWMO1 of the first comparator 310 is increased by the first gain value G1. Thus, during the first interval, the pulse width of the solid line is increased by the first gain value G1 with respect to the pulse width of the dotted line in FIG. 14A. The increased pulse width means an increase of turn-ON time of the pull-up transistor 510 in the output stage 500. In addition, it is noted that the second input signal OM2 is scaled by the second gain value G2 with respect to the input signal OM22, and the pulse width of the second output signal PWMO2 of the second comparator 320 is decreased by the second gain value G2. Thus, during the second interval, the pulse width of the solid line is decreased by the second gain value G2 with respect to the pulse width of the dotted line in FIG. 14A. The decreased pulse width means a decrease of turn-ON time of the pull-down transistor 520 in the output stage 500. Thus, when the level of the first and second power supply voltages VDD and VSS vary, the prescaling unit 100 scales the input signals IM1 and IM2 with the gain values G1 and G2 for inversely compensating for the level variations of the first and second power supply voltages VDD and VSS. These scalings increase or decrease turn-ON times of the pull-up transistor 510 and pull-down transistor 520.

Although the first and second input signals OM1 and OM2 are illustrated as being analog signals having sinusoidal waves in FIG. 13, the first and second input signals OM1 and OM2 may have different wave shapes than the wave as illustrated in FIG. 13, because the first and second scaled signals SIM1 and SIM2 are respectively sigma-delta modulated into first and second input signals OM1 and OM2.

Although the first and second comparators 310 and 320 are respectively included in FIG. 6, the first and second comparators 310 and 320 may be alternatively implemented with only one comparator and some switches configured so that one comparator comparing the first input signal OM1 with the first triangular wave SA 1 during the first interval and comparing the second input signal OM2 with the second triangular wave SA2 during the second interval to output the PWM signal PWMO.

Figure 15A:
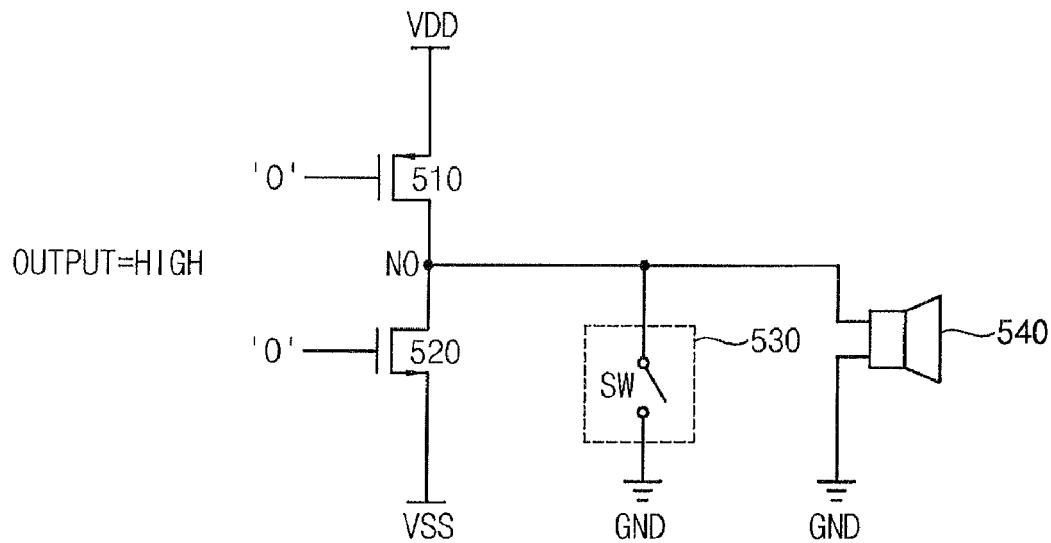
FIGS. 15A through 15C are copies of the circuit diagram of FIG. 7 illustrating three modes of operation of the output stage 700 of FIG. 7.
Figure 15B:
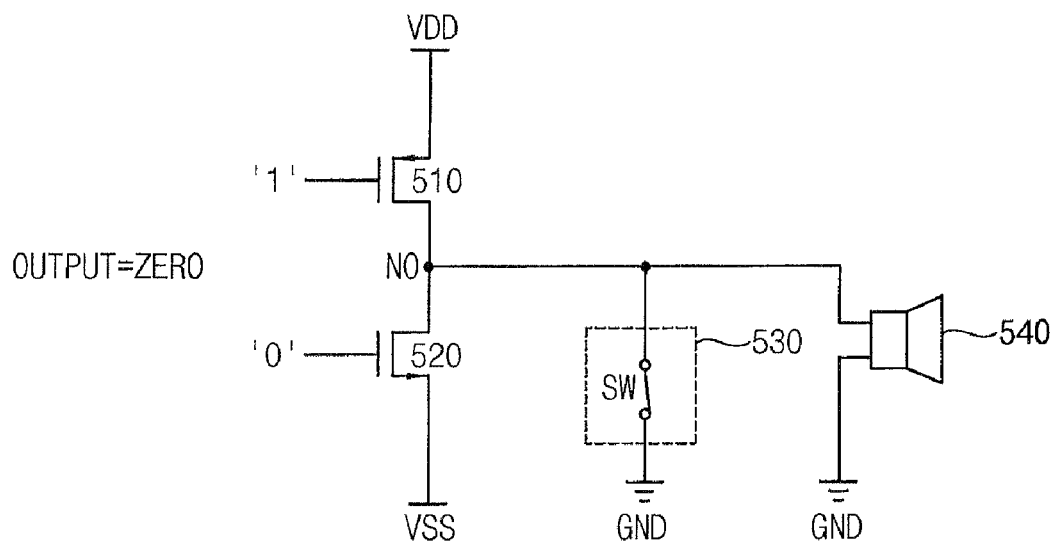
Figure 15C:
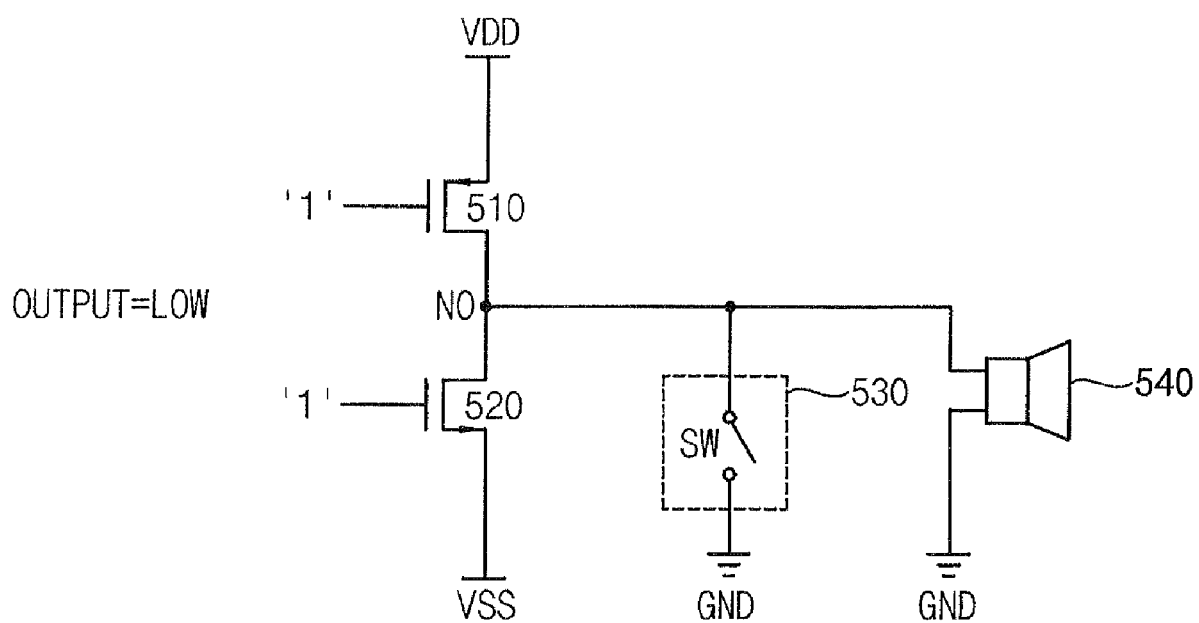

FIGS. 15A through 15C are copies of the circuit diagram of FIG. 7 illustrating three modes of operation of the switches in the output stage 700 of FIG. 7.

Figures 16, 17:
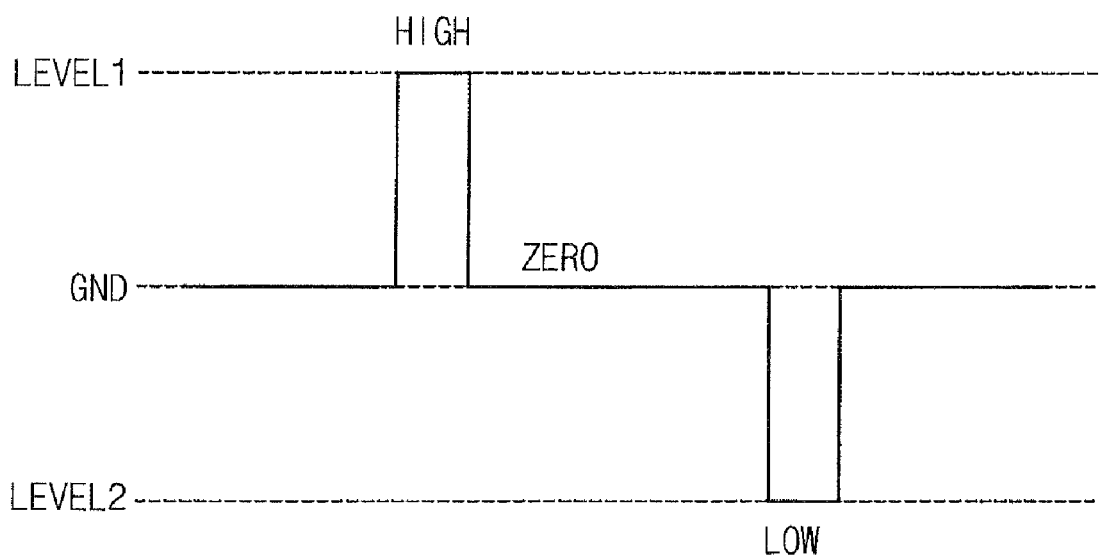
FIG. 16 is a graph illustrating the three levels of the PWM signals of the three-level PWM amplifier 10 or 20 of FIGS. 3 and 4.
FIG. 17 is a table illustrating the mapper in FIG. 3 controlling the three modes of operation of the switches in output stage 700 of FIG. 7.

FIG. 16 illustrates levels of the PWM signals.

FIG. 17 is a table of the mapper in FIG. 3.

Referring to FIGS. 15A through 17, the PWM signal PWMO from the PWM generator 300 has three levels: the first level LEVEL1; the reference level GND; and the second level LEVEL2, as illustrated in FIG. 16. The first level LEVEL1 may be higher than the reference level GND, while the second level LEVEL2 may be lower than the reference level GND. Therefore, the switches of the output stage 500 operates in one of three modes according to the level of the PWM signal PWMO as illustrated in FIGS. 15A through 15C. AS illustrated in FIG. 16, enable signals EN1, EN2 and EN3 may be selectively enabled based on the level of the PWM signal PWMO.

When the level of the PWM signal PWMO is the first level LEVEL1, the first enable signal EN1 is low-enabled and the second and third enable signals EN1 and EN2 are disabled. Therefore, the output stage 500 drives the output node NO to the first power supply voltage VDD.

When the level of the PWM signal PWMO is the second level LEVEL2, the second enable signal EN2 is high-enabled and the first and third enable signals EN2 and EN3 are disabled. Therefore, the output stage 500 drives the output node NO to the second power supply voltage VSS.

When the level of the PWM signal PWMO is the reference level GND, the third enable signal EN3 is high-enabled and the first and second enable signals EN1 and EN2 are disabled. Therefore, the output stage 500 drives the output node NO to the third power supply voltage GND.

When the output stage 500 drives the output node NO according to the level of the PWM signal PWMO, turn-ON time of the pull-up transistor 510 may be increased to compensate for the level variation of the first power supply voltage VDD, and turn-ON time of the pull-down transistor 520 may be increased to compensate for the level variation of the second power supply voltage VSS.

Figure 18A:
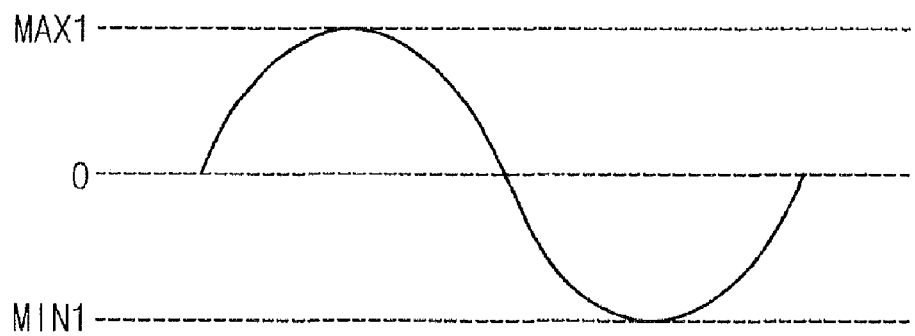
FIG. 18A is a graph illustrating an example input signal to the PWM amplifier.

FIG. 18A is a graph illustrating an example input signal to the PWM amplifier.

Figure 18B:
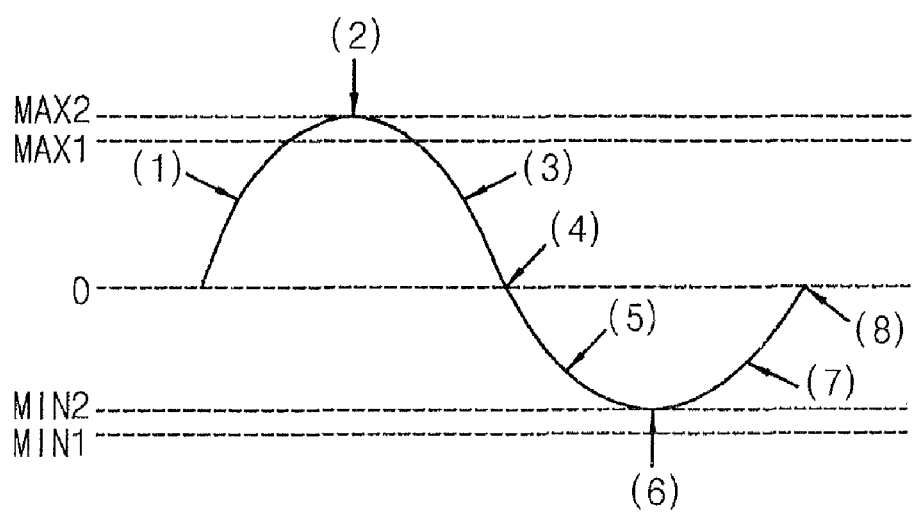
FIG. 18B illustrates the signal of FIG. 18A scaled according to exemplary embodiments.

FIG. 18B illustrates the signal of FIG. 18A scaled according to exemplary embodiments.

Figure 19A:
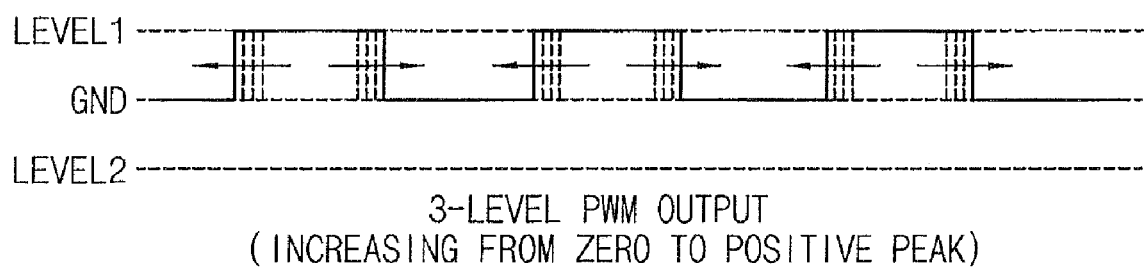
FIGS. 19A through 19H illustrate the three-level PWM signal with respect to the scaled signal of FIG. 18B according to exemplary embodiments.

FIGS. 19A through 19I4 are graphs illustrating the three-level PWM signal with respect to the scaled signal of FIG. 18B according to exemplary embodiments.

As illustrated in FIG. 18A, the input signal IM to the half-bridge three-level PWM amplifier 10 of FIG. 3 swings between a positive peak voltage MAX1 and a negative peak voltage MIN1. As illustrated in FIG. 18B, the scaled signal SIM from the prescaling unit 100 swings between a positive peak voltage MAX2 and a negative peak voltage MIN2.

Figure 1:
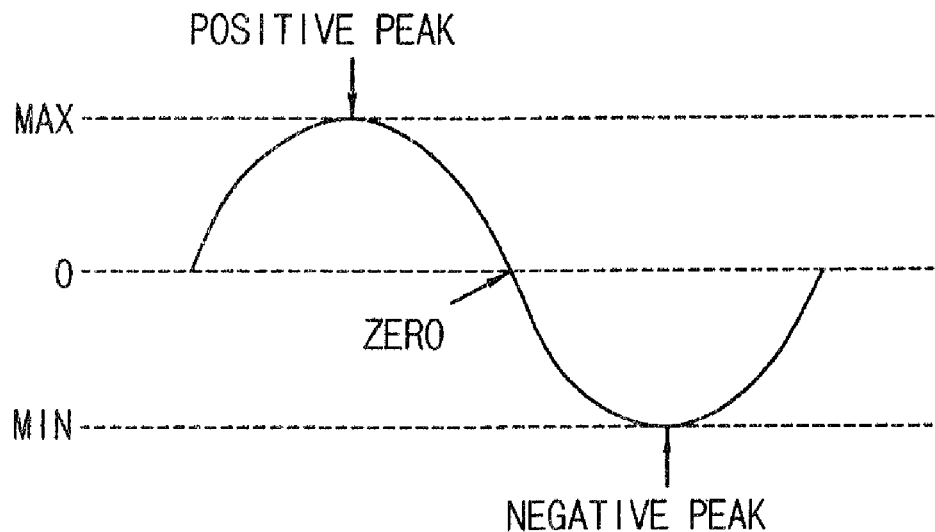
FIG. 1 is a graph of a waveform illustrating an example of an analog amplifier input signal.

Referring to FIGS. 18B through 19H, when the scaled signal SIM go through 8 changes (1)~(8) as illustrated in FIG. 18B, the PWM signals PWMO switches among the three levels (LEVEL1, GND and LEVEL3) as illustrated in FIGS. 19A through 19I1.

As illustrated in FIG. 19A, when the scaled signal SIM changes from zero to the positive peak voltage MAX2 (denoted as (1) in FIG. 18B), the PWM signal PWMO has a pulse width with increasing first level LEVEL1. At the positive peak voltage MAX2 (denoted as (2) in FIG. 18B), the maximum pulse-width signal at the first level LEVEL1 may be output at every period of the PWM signal PWMO. The PWM signal PWMO has the ground level when the PWM signal PWMO does not have the first level LEVEL1, and thus, unnecessary current consumption may be avoided.

Figure 19B:
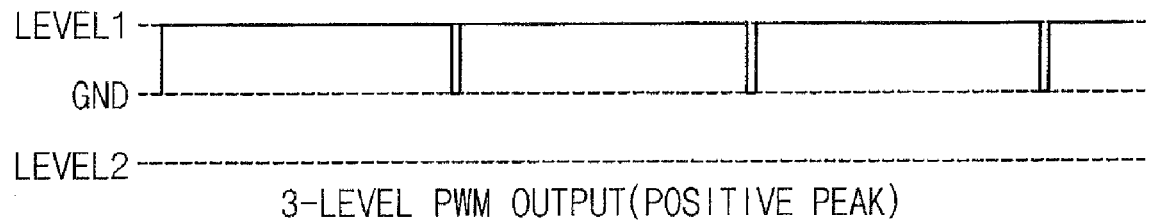

As illustrated in FIG. 19B, when the scaled signal SIM arrives at the positive peak voltage MAX2 (denoted as (2) in FIG. 18B), the PWM signal PWMO has a pulse width with maximum first level LEVEL1.

Figure 19C:
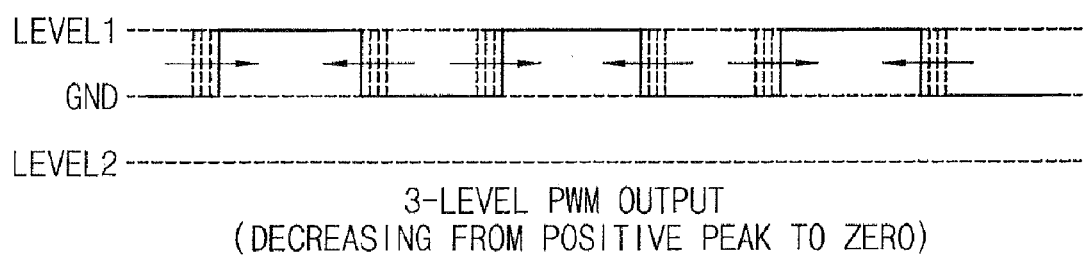

As illustrated in FIG. 19C, when the scaled signal SIM changes from the positive peak voltage MAX2 to zero (denoted as (3) in FIG. 18B), the first level LEVEL1 PWM signal PWMO has a decreasing pulse width.

Figure 19D:
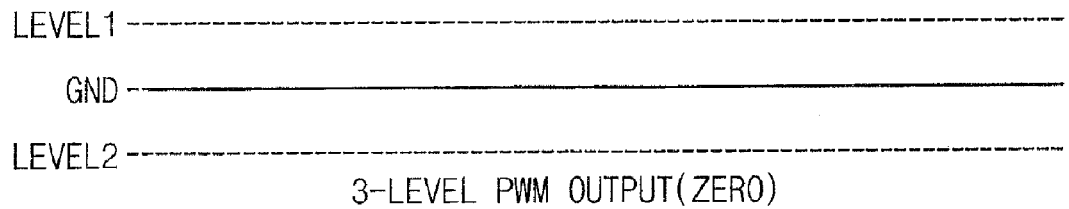

As illustrated in FIG. 19D, when the scaled signal SIM arrives at zero (as denoted as (4) in FIG. 18B), the PWM signal PWMO substantially has constant ground level.

Figure 2A:
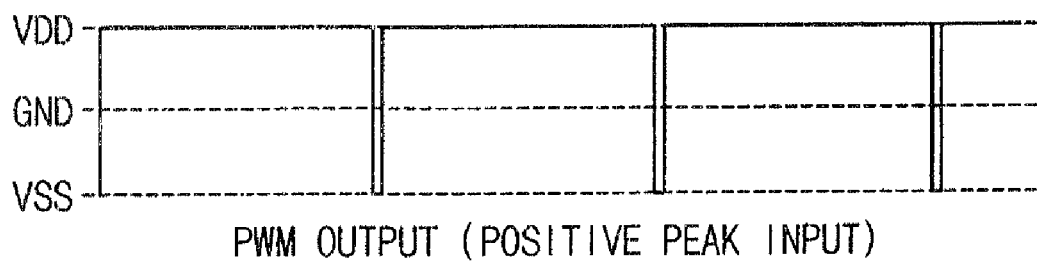
FIG. 2 (FIGS. 2a, 2b, and 2c) illustrates a conventional two-level PWM output signal with respect to the example analog amplifier input signal of FIG. 1.
Figure 2B:
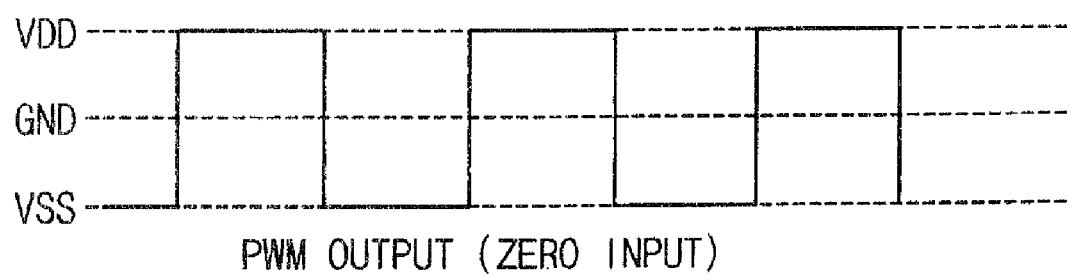
Figure 2C:
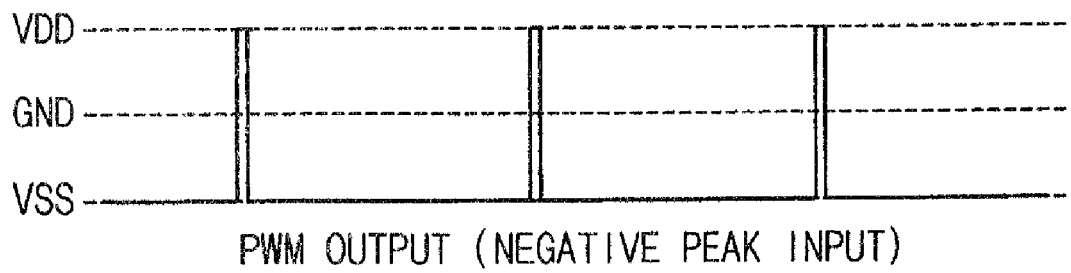

As illustrated in FIGS. 1 and 2, when the PWM signal has two levels and the input signal is zero, the two-level PWM signal has 0.5 ("50:50") duty ratio with same high period and same low period. Therefore maximum switching current consumption occurs. By contrast, the three level PWM signal PWMO has substantially less switching current consumption even when the input signal IM (or the scaled signal SIM) is zero.

Figure 19E:
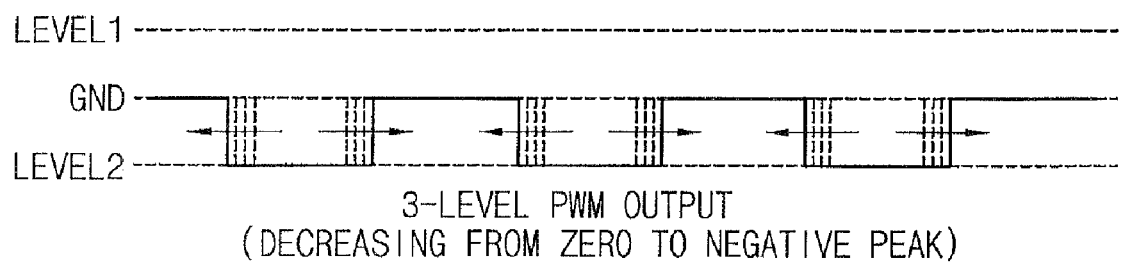

As illustrated in FIG. 19E, when the scaled signal SIM changes from zero to the negative peak voltage MIN2 (denoted as (5) in FIG. 18B), the second level LEVEL2 PWM signal PWMO has an increasing pulse width. The PWM signal PWMO has ground level when the PWM signal PWMO does not have the second level LEVEL2, and thus, unnecessary switching current consumption may be avoided.

Figure 19F:
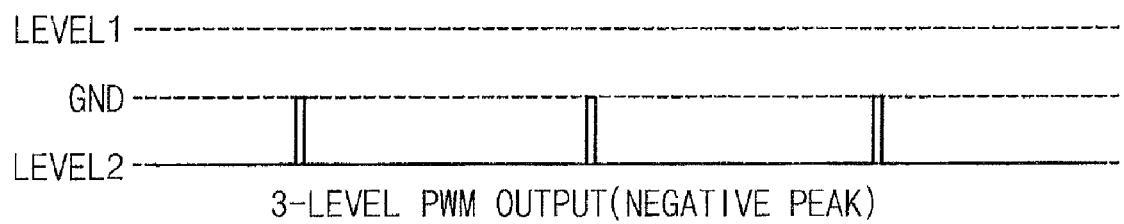

As illustrated in FIG. 19F, when the scaled signal SIM arrives at the negative peak voltage MIN2 (denoted as (6) in FIG. 18B), the PWM signal PWMO has a maximum second level LEVEL2 pulse width.

Figure 19G:
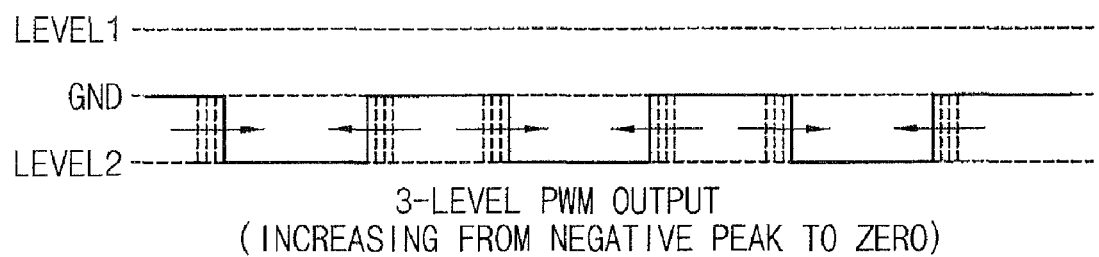
Figure 19H:
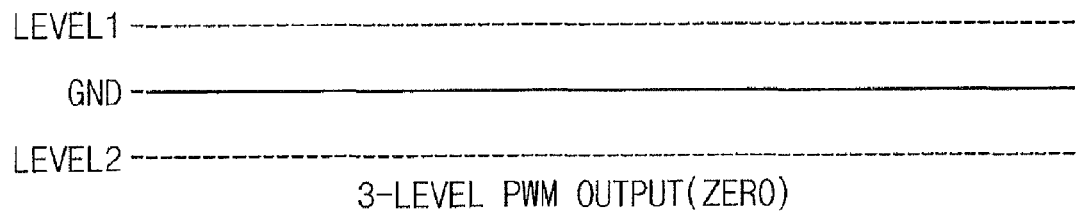

As illustrated in FIG. 19G, when the scaled signal SIM changes from the negative peak voltage MIN2 to zero (denoted as (7) in FIG. 18B), the second level LEVEL2 PWM signal PWMO has a decreasing pulse width.

As illustrated in FIG. 19F, when the scaled signal SIM arrives at zero (as denoted as (8) in FIG. 18B), the PWM signal PWMO substantially has ground level.

The FIGS. 13 through the 19F, describe an exemplary embodiment where the first and second input signals IM1 and IM2 are respectively scaled. However, the descriptions with reference to FIGS. 13 through the 19F may be applicable to a case when only one of the first and second input signals IM1 and IM2 is scaled as illustrated in FIG. 10 or FIG. 11. In addition, although with reference to FIG. 13 through the 19F, there are descriptions about a case when the level of the first power supply voltage VDD decreases by $^\Delta$VDD and the level of the second power supply voltage VDD increases by $^\Delta$VSS, the exemplary embodiments may be applicable when the level of the first power supply voltage VDD increases by $^\Delta$VDD and the level of the second power supply voltage VDD decreases by $^\Delta$VSS.

Figure 20:
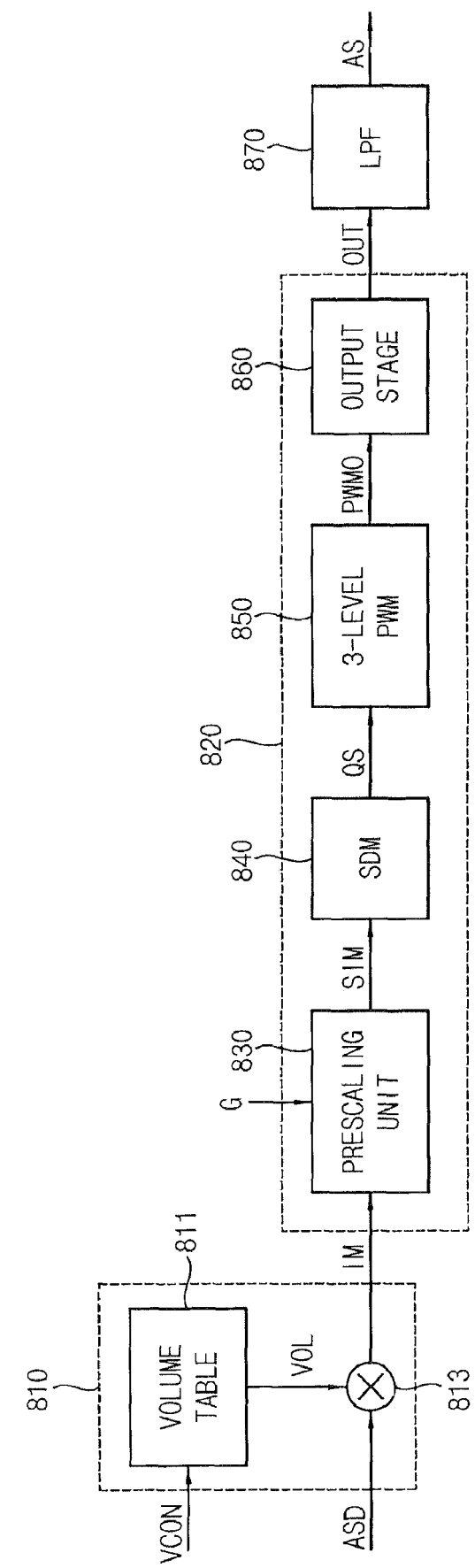
FIG. 20 is a block diagram of an audio processing apparatus according to exemplary embodiments.

FIG. 20 is a block diagram of an audio processing apparatus according to another exemplary embodiment.

Referring to FIG. 20, an audio processing apparatus 800 includes a volume control unit 810 and a half-bridge three-level PWM amplifier 820 implemented according to any embodiment of the invention. The half-bridge three-level PWM amplifier 820 may be implemented as the half-bridge three-level PWM amplifier 10 of FIG. 3 or as the half-bridge three-level PWM amplifier 20 of FIG. 4. The half-bridge three-level PWM amplifier 820 may include a prescaling unit 830, a SDM 840, a three-level PWM generator 850, a mapper 860 and an output stage 860. The half-bridge three-level PWM amplifier 820 may further include a low pass filter (LPF) 870.

The volume control unit 810 includes a volume table 811 and a multiplier 813. The volume table 811 outputs a volume value VOL in response to a received volume control signal VCON. The volume value VOL is a level control value for controlling the level of audio source data ASD. The audio source data ASD may be a pulse code modulation (PCM) data.

The volume table 811 stores a table for mapping the volume control signal VCON to the volume value VOL. When a user of the audio processing apparatus 800 controls the volume of an audio signal, the volume control signal VCON corresponding to the use's control may be generated. The volume control signal VCON is a digital code including a plurality of bits. For example, when the volume control signal VCON includes 4 bits, volume may be controlled at 16 levels.

The multiplier 813 multiplies the audio source data ASD by the volume value VOL and outputs volume-controlled input signal IM. Thus, the multiplier 813 amplifies or attenuates the level of the audio source data ASD according to the volume value VOL. When the volume value VOL is greater than 1 (0 dB), the level of the audio source data ASD is amplified. When the volume value VOL is less than 1 (0 dB), the level of the audio source data ASD is attenuated. By default, the volume value may be 1 (0 dB).

The audio source data ASD may be obtained by performing PCM on a digital signal resulting from sampling and digitizing an analog audio signal at a predetermined sampling rate (i.e., 48 kHz). Each sample of the digital audio source data ASD may be include a plurality of bits, e.g. 16 or 20 bits.

The prescaling unit 830 scales the input signal IM according to at least one gain value G to provide a scaled signal SIM. The SDM 840 sigma-delta modulates the input signal IM to output a modulated signal QS. The three-level PWM amplifier 850 generates a PWM signal PWMO having three levels (the first level, the second level and the reference level) by varying the pulse width and selecting its level according to a magnitude (level) of the modulated signal QS. The output stage 860 drives an output node NO at the level of a first power supply voltage VDD, of a second power supply voltage VSS or of a third power supply voltage GND based on the three-level PWM signal PWMO. The output stage 860 provides an output signal OUT, and the LPF 870 low-pass filters the output signal OUT to recover an audio signal AS.

As mentioned above, the half-bridge three-level PWM amplifier according to exemplary embodiments is capable of preventing unnecessary switching current consumption and facilitates recovering an undistorted audio signal even while asymmetric variations of the power supply voltages occurs in the output stage 860. Accordingly, the half-bridge three-level PWM amplifier according to exemplary embodiments may have enhanced performance and may consume less power.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A three-level pulse width modulation (PWM) amplifier comprising:
   a prescaling unit including:
      a signal separator configured to separate an input signal into a first separated input signal and a second separated input signal based on a reference level, the first separated input signal only having levels equal to or higher than the reference level, the second separated input signal having levels lower than the reference level; and
      a scaler configured to multiply the first separated input signal by a first gain value to provide the scaled first separated input signal to a PWM generator;
   the PWM generator, wherein the PWM generator is configured to generate a three-level PWM signal having a first level, a second level and the reference level by varying based on the scaled first separated input signal the width of pulses having the first level and by varying based on the second separated input signal the width of pulses having the second level; and an output stage configured to drive an output node to the level of a first power supply voltage, of a second power supply voltage or of a third power supply voltage based on the three-level PWM signal.

2. The three-level PWM amplifier of claim 1, wherein:
the prescaling unit is configured to scale the first separated input signal according to a first gain value to provide the scaled first separated input signal to the PWM generator, wherein
the first gain value has a magnitude that compensates for a variation of at least one of the first through third power supply voltages.

3. The three-level PWM amplifier of claim 1, wherein the third power supply voltage corresponds to a ground level, the first power supply voltage corresponds to a positive voltage higher than the third power supply voltage, and the second power supply voltage corresponds to a negative voltage lower than the third power supply voltage.

4. The three-level PWM amplifier of claim 2, further comprising a power level sensing unit configured to provide the first gain value to the prescaling unit based on the level variation of at least one of the first and second power supply voltages.

5. The three-level PWM amplifier of claim 3, wherein the power level sensing unit comprises:
an analog to digital converter configured to measure and provide digital values corresponding to the measured level of the first power supply voltage and the measured level of the second power supply voltages; and
a calculation unit configured to calculate and provide the first gain value based on the digital values.

6. The three-level PWM amplifier of claim 4, wherein the calculation unit compares the digital values to provide the first gain value.

7. The three-level PWM amplifier of claim 5, wherein the calculation unit provides the first gain value based on an ideal level of the first power supply voltage and based on the measured level of the first power supply voltage; and wherein the calculation unit provides the second gain value based on an ideal level of the second power supply voltage and based on the measured level of the second power supply voltage.

8. The three-level PWM amplifier of claim 2, wherein the scaler is configured to multiply the second separated input signal by a second gain value to provide the scaled second separated input signal; and wherein the prescaling unit further comprises
an adder configured to sum the scaled first separated input signal and the scaled second separated input signal to provide a scaled recombined input signal to the PWM generator.

9. The three-level PWM amplifier of claim 8, wherein the prescaling unit provides the first scaled separated input signal by multiplying the first input signal by the first gain value.

10. The three-level PWM amplifier of claim 8, wherein the prescaling unit provides the second scaled signal by multiplying the second input signal by the second gain value.

11. The three-level PWM amplifier of claim 8, wherein the prescaling unit scales the first and second separated input signals asymmetrically.

12. The three-level PWM amplifier of claim 1, wherein the PWM generator combines a positive first PWM signal and a negative second PWM signal to output the three-level PWM signal, the first PWM signal is obtained by varying the pulse width having the first level according to a positive first signal portion and the second PWM signal is obtained by varying the pulse width having the second level according to a negative second signal portion, the first and second signal portions being included in the input signal, the first signal portion having a voltage level equal to or higher than the reference level, the second signal portion having a voltage level lower than the reference level.

13. The three-level PWM amplifier of claim 12, wherein the reference level corresponds to a ground level, the first signal portion is a positively scaled signal, and the second signal portion is a negatively scaled signal.

14. The three-level PWM amplifier of claim 12, wherein the PWM generator comprises:
a first comparator configured to compare the first separated input signal with a first triangular wave signal to output the first PWM signal; and
a second comparator configured to compare the second separated input signal with a second triangular wave signal to output the second PWM signal.

15. The three-level PWM amplifier of claim 1, wherein the output stage comprises:
a pull-up unit that drives the output node to the level of the first power supply voltage in response to a first enable signal;
a pull-down unit that drives the output node to the level of the second power supply voltage in response to a second enable signal; and
a switching ground unit that drives the output node to the level of the third power supply voltage in response to a third enable signal,
wherein the third power supply voltage corresponds to a ground level, the first power supply voltage corresponds to a positive voltage higher than the third power supply voltage, and the second power supply voltage corresponds to a negative voltage lower than the third power supply voltage.

16. The three-level PWM amplifier of claim 15,
wherein the pull-up unit includes a pull-up transistor, connected between the output node and the first power supply voltage, which is turned ON/OFF in response to the first enable signal;
wherein the pull-down unit includes a pull-down transistor, connected between the output node and the second power supply voltage, which is turned ON/OFF in response to the second enable signal; and
wherein the switching ground unit includes at least one switch, connected between the output node and the third power supply voltage, which is turned ON/OFF in response to the third enable signal.

17. The three-level PWM amplifier of claim 1, wherein the input signal is a sigma-delta modulated signal.

18. The three-level PWM amplifier of claim 1 wherein the amplifier is a half-bridge three-level pulse width modulation (PWM) amplifier.

19. A three-level pulse width modulation (PWM) amplifier comprising:
a PWM generator configured to generate a three-level PWM signal having a first level, a second level and a reference level by varying based on an input signal the width of pulses having the first level and by varying based on the input signal the width of pulses having the second level;
an output stage configured to drive an output node to the level of a first power supply voltage, of a second power supply voltage or of a third power supply voltage based on the three-level PWM signal;
wherein the third power supply voltage corresponds to a ground level, the first power supply voltage corresponds to a positive voltage higher than the third power supply voltage, and the second power supply voltage corresponds to a negative voltage lower than the third power supply voltage; and further comprising a power level sensing unit configured to provide the at least one gain value to the prescaling unit based on the level variation of at least one of the first and second power supply voltages; and wherein the power level sensing unit comprises:

an analog to digital converter configured to measure and provide digital values corresponding to the measured level of the first power supply voltage and the measured level of the second power supply voltages; and a calculation unit configured to calculate and provide the at least one gain value based on the digital values.

20. A three-level pulse width modulation (PWM) amplifier comprising:

a PWM generator configured to generate a three-level PWM signal having a first level, a second level and a reference level by varying based on an input signal the width of pulses having the first level and by varying based on the input signal the width of pulses having the second level; and an output stage configured to drive an output node to the level of a first power supply voltage, of a second power supply voltage or of a third power supply voltage based on the three-level PWM signal;

further comprising:

a prescaling unit configured to scale the input signal according to at least one gain value to provide the scaled input signal to the PWM generator, wherein the at least one gain value has a magnitude that compensates for a variation of at least one of the first through third power supply voltages;

further comprising a power level sensing unit configured to provide the at least one gain value to the prescaling unit based on the level variation of at least one of the first and second power supply voltages; and wherein the calculation unit compares the digital values to provide the at least one gain value.

* * * * *